US011862659B2

United States Patent
Muramatsu et al.

(10) Patent No.: US 11,862,659 B2
(45) Date of Patent: Jan. 2, 2024

(54) BACKSIDE INCIDENT-TYPE IMAGING ELEMENT

(71) Applicant: HAMAMATSU PHOTONICS K.K., Hamamatsu (JP)

(72) Inventors: Masaharu Muramatsu, Hamamatsu (JP); Shin-ichiro Takagi, Hamamatsu (JP); Yasuhito Yoneta, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 223 days.

(21) Appl. No.: 17/608,212

(22) PCT Filed: Jul. 3, 2020

(86) PCT No.: PCT/JP2020/026253
§ 371 (c)(1),
(2) Date: Nov. 2, 2021

(87) PCT Pub. No.: WO2021/049140
PCT Pub. Date: Mar. 18, 2021

(65) Prior Publication Data
US 2022/0208809 A1  Jun. 30, 2022

(30) Foreign Application Priority Data
Sep. 12, 2019 (JP) ................................. 2019-166268

(51) Int. Cl.
| | |
|---|---|
| H01L 27/146 | (2006.01) |
| H04N 25/772 | (2023.01) |
| H04N 25/778 | (2023.01) |

(52) U.S. Cl.
CPC ....... *H01L 27/1464* (2013.01); *H04N 25/772* (2023.01); *H04N 25/778* (2023.01)

(58) Field of Classification Search
None
See application file for complete search history.

(56) References Cited

U.S. PATENT DOCUMENTS

| | | | |
|---|---|---|---|
| 8,835,211 B1* | 9/2014 | Chen ...................... | H01L 31/18 257/225 |
| 9,484,370 B2* | 11/2016 | Leung ............... | H01L 27/14641 |

(Continued)

FOREIGN PATENT DOCUMENTS

| | | |
|---|---|---|
| CN | 1929146 | 3/2007 |
| CN | 108140659 A | 6/2018 |

(Continued)

OTHER PUBLICATIONS

English translation of KR 101745638 B1, Jan. 2011, (Year: 2011).*

(Continued)

*Primary Examiner* — James M Hannett
(74) *Attorney, Agent, or Firm* — Faegre Drinker Biddle & Reath LLP

(57) ABSTRACT

A backside incident-type imaging element includes a semiconductor substrate having a front surface and a back surface on an opposite side from the front surface, a ground potential being applied to the semiconductor substrate, and a semiconductor layer formed on the front surface, in which the semiconductor layer has a first element part that includes a light receiving portion generating a signal charge according to incident light from a side of the back surface and outputs a signal voltage corresponding to the signal charge, and a second element part that includes an analog-digital converter converting the signal voltage output from the first element part into a digital signal.

5 Claims, 6 Drawing Sheets

(56) References Cited

U.S. PATENT DOCUMENTS

| | | |
|---|---|---|
| 2004/0021788 A1 | 2/2004 | Shizukuishi |
| 2012/0153419 A1* | 6/2012 | Itonaga ............. H01L 21/76898 |
| | | 438/66 |
| 2015/0200216 A1* | 7/2015 | Muramatsu ......... H01L 27/1464 |
| | | 438/72 |
| 2016/0126267 A1* | 5/2016 | Barr .................... H01L 27/1464 |
| | | 257/447 |

FOREIGN PATENT DOCUMENTS

| | | |
|---|---|---|
| JP | H10-125884 A | 5/1998 |
| JP | H10-125885 A | 5/1998 |
| JP | 2004-064410 A | 2/2004 |
| KR | 101745638 B1 * | 1/2011 |
| KR | 20190038502 A * | 3/2019 |
| WO | WO 2004/047178 A1 | 6/2004 |

OTHER PUBLICATIONS

English translation of KR 20190038502 A, Mar. 2019, Kim et al.(Year: 2019).*

English-language translation of International Preliminary Report on Patentability (IPRP) dated Mar. 24, 2022 that issued in WO Patent Application No. PCT/JP2020/026253.

Boulenc, Pierre, et al., "High Speed Backside Illuminated TDI CCD-in-CMOS Sensor," <http://www.imagesensors.org/Past%20Workshops/2017%20Workshop/2017%20Papers/R50.pdf, May 30, 2017, pp. 364-367.

* cited by examiner

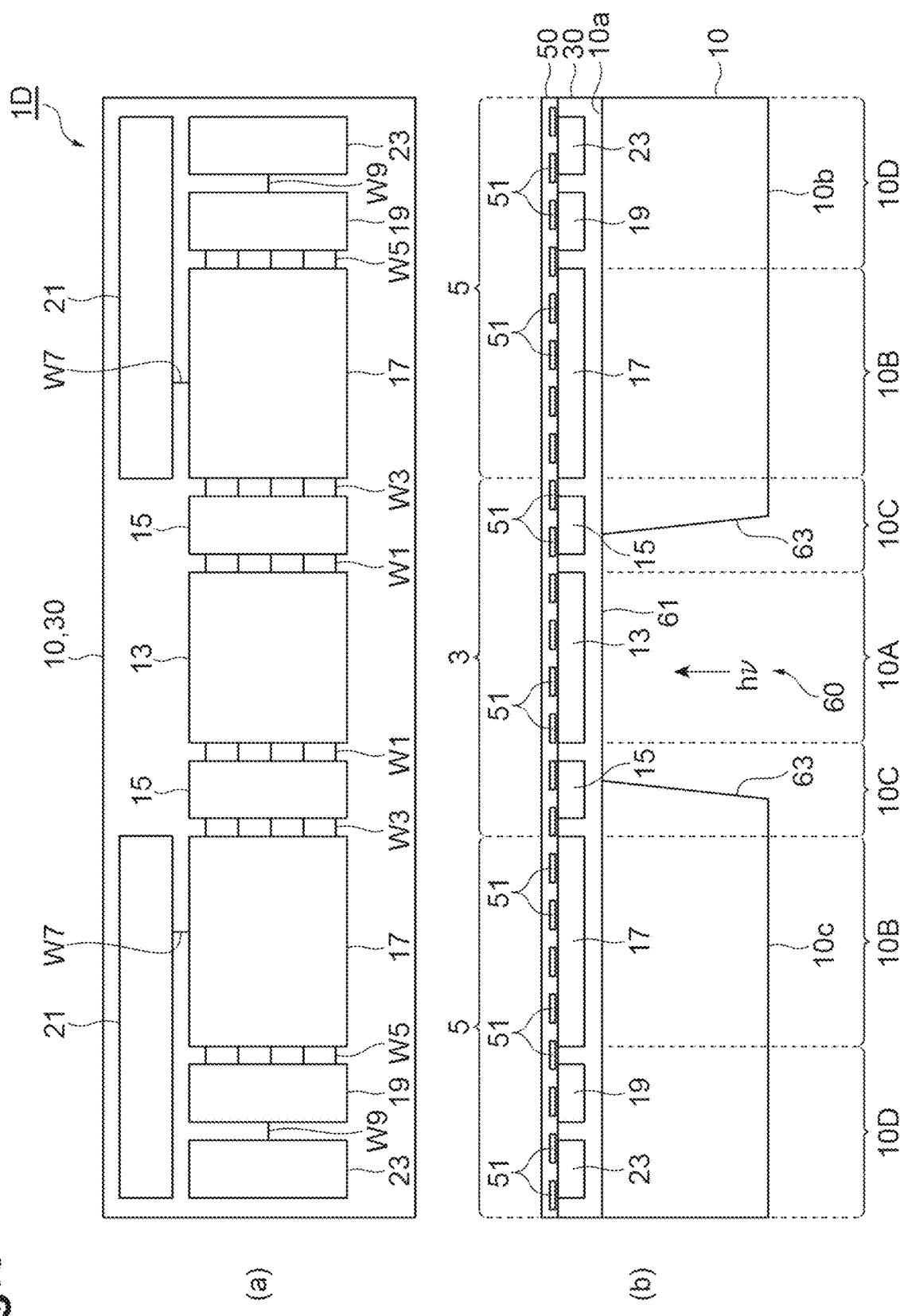

BACKSIDE INCIDENT-TYPE IMAGING ELEMENT

TECHNICAL FIELD

The present disclosure relates to a backside incident-type imaging element.

BACKGROUND ART

Currently, a monolithic CCD-CMOS sensor has been known in which a CCD unit responsible for light reception and charge transfer and a CMOS unit responsible for signal processing such as analog-to-digital conversion are formed in one chip. Non Patent Literature 1 describes a CCD-in-CMOS sensor. Backside illumination is possible with this CCD-in-CMOS sensor.

CITATION LIST

Non Patent Literature

Non Patent Literature 1: Pierre Boulenc, Jo Robbelein, Linkun Wu, Vasyl Motsnyi, Luc Haspeslagh, Stefano Guerrieri, Jonathan Borremans, Maarten Rosmeulen "High Speed Backside Illuminated TDI CCD-in-CMOS Sensor" [Searched on Jul. 29, 2019], Internet http://www.imagesensors.org/Past%20Workshops/2017%20Workshop/2017%20Papers/R50.pdf

SUMMARY OF INVENTION

Technical Problem

At present, in the monolithic CCD-CMOS sensor described above, there is an increasing demand for high speed. However, as the speed of analog-digital conversion increases with the increase in speed, current consumption of a signal processing circuit increases and a change in the amount of current consumption increases. As a result, there may be a problem that a ground potential (substrate potential) tends to fluctuate. Fluctuations in the ground potential have adverse effects such as causing a malfunction of the signal processing circuit and superimposing noise on an output signal of the CCD unit.

In particular, when a structure for thinning a substrate to expose a light sensitive region from the substrate and causing light to directly incident on the light sensitive region for the purpose of increasing sensitivity of the sensor to compensate for a decrease in the amount of light incident on the sensor due to the increase in speed, this problem becomes apparent. A reason is that the substrate functioning as a ground of the signal processing circuit has a high resistance due to thinning That is, in the conventional monolithic CCD-CMOS sensor, it is difficult to improve the processing speed by achieving both high sensitivity and stabilization of the ground.

An object of the disclosure is to provide a backside incident-type imaging element capable of improving processing speed.

Solution to Problem

A backside incident-type imaging element according to the disclosure includes a semiconductor substrate having a front surface and a back surface on an opposite side from the front surface, a ground potential being applied to the semiconductor substrate, and a semiconductor layer formed on the front surface, in which the semiconductor layer has a first element part including a light receiving portion configured to generate a signal charge according to incident light from a side of the back surface and configured to output a signal voltage corresponding to the signal charge, and a second element part including an analog-digital converter configured to convert the signal voltage output from the first element part into a digital signal, and a thickness of the semiconductor substrate in a first direction intersecting the front surface and the back surface is relatively thicker in a second region of the semiconductor substrate corresponding to the analog-digital converter when viewed in the first direction than in a first region of the semiconductor substrate corresponding to the light receiving portion when viewed in the first direction.

In this backside incident-type imaging element, the semiconductor layer formed on the front surface of the semiconductor substrate has the first element part and the second element part. The first element part includes the light receiving portion that generates a signal charge according to incident light from the back surface side of the semiconductor substrate. In addition, the second element part includes the analog-digital converter that converts the signal voltage into the digital signal. Further, the thickness of the semiconductor substrate is relatively thicker in the second region corresponding to the analog-digital converter than in the first region corresponding to the light receiving portion. In other words, the semiconductor substrate is thin in the region corresponding to the light receiving portion and thickened in the region corresponding to the analog-digital converter. As a result, the amount of incident light from the first region of the semiconductor substrate to the light receiving portion is increased, and the resistance of the second region corresponding to the analog-digital converter of the semiconductor substrate is avoided. Therefore, according to this backside incident-type imaging element, the processing speed can be improved by achieving both high sensitivity and stabilization of the ground.

In the backside incident-type imaging element according to the disclosure, the semiconductor substrate may include a third region located between the first region and the second region when viewed in the first direction, and the thickness of the semiconductor substrate may be made relatively thinner in the first region than in the second region by a recess provided on the back surface from the first region to the third region. In this instance, in the backside incident-type imaging element according to the disclosure, an inner side surface of the recess may include an inclined surface located in the third region and inclined so that the thickness of the semiconductor substrate gradually increases from the first region to the second region. In this way, the first region may be made thinner and the second region may be made thicker by the recess provided on the back surface of the semiconductor substrate.

In the backside incident-type imaging element according to the disclosure, the first element part may include an amplifier configured to convert the signal charge generated by the light receiving portion into the signal voltage, and the amplifier may be located in the third region when viewed in the first direction. In this way, it is possible to dispose the amplifier rarely affected by the thickness of the semiconductor substrate in the third region.

In the backside incident-type imaging element according to the disclosure, the semiconductor layer may be exposed from the semiconductor substrate at a bottom of the recess.

In this case, the amount of incident light from the first region to the light receiving portion can be further increased.

Advantageous Effects of Invention

According to the disclosure, it is possible to provide a backside incident-type imaging element capable of improving processing speed.

BRIEF DESCRIPTION OF DRAWINGS

FIG. 6 is a schematic view illustrating a backside incident-type imaging element according to a fourth modification.

DESCRIPTION OF EMBODIMENTS

Hereinafter, one embodiment will be described in detail with reference to the drawings. In each figure, the same or corresponding elements may be designated by the same reference symbols, and duplicate description may be omitted.

Figure 1:
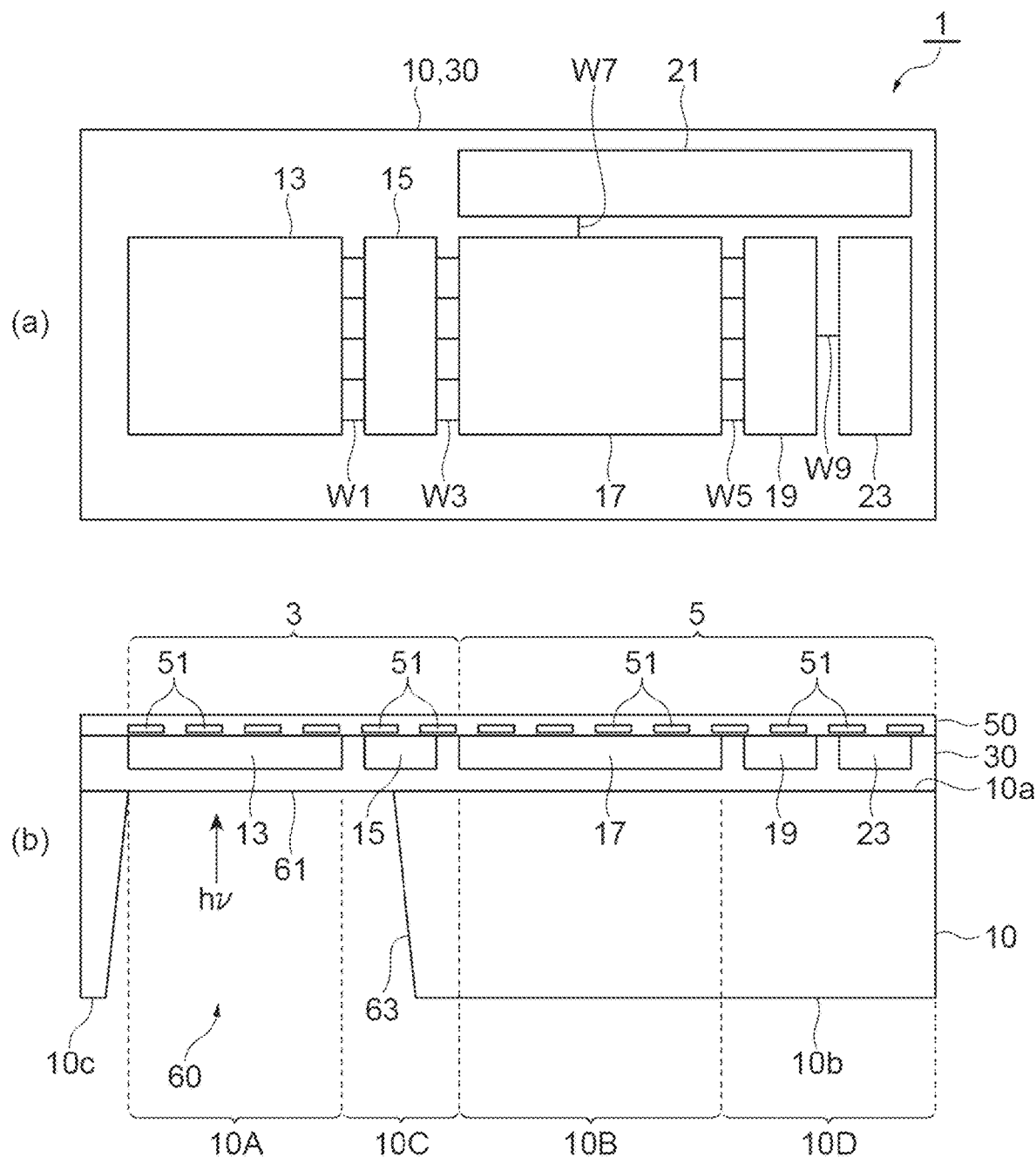
FIG. 1 is a schematic view illustrating a backside incident-type imaging element according to an embodiment.
Figure 2:
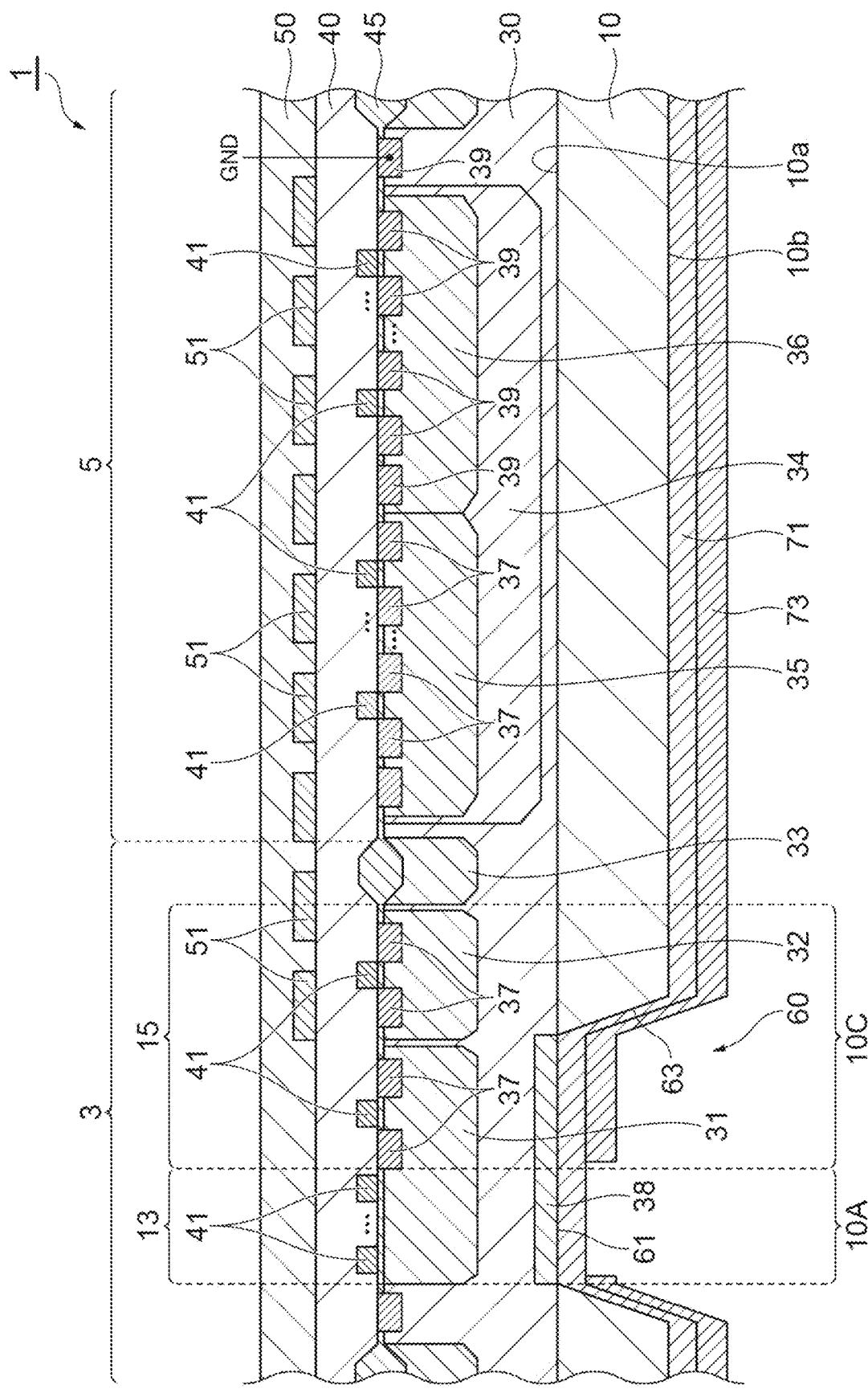
FIG. 2 is a detailed cross-sectional view of the backside incident-type imaging element illustrated in FIG. 1.

FIG. 1 is a schematic view illustrating a backside incident-type imaging element according to the present embodiment. FIG. 1($a$) is a plan view, and FIG. 1($b$) is a schematic cross-sectional view. FIG. 2 is a detailed cross-sectional view of the backside incident-type imaging element illustrated in FIG. 1. As illustrated in FIGS. 1 and 2, the backside incident-type imaging element 1 includes a first element part 3 and a second element part 5. The first element part 3 is, for example, a CCD (charge coupled device) unit responsible for light reception and charge transfer, and the second element part 5 is, for example, a CMOS (complementary metal oxide semiconductor) unit responsible for signal processing such as analog-digital conversion. That is, the backside incident-type imaging element 1 is, for example, a monolithic CCD-COMS sensor. An example of a size of the backside incident-type imaging element 1 is about 20 mm in a longitudinal direction and about 10 mm in a short direction in a plan view.

The backside incident-type imaging element 1 includes a semiconductor substrate 10, a semiconductor layer 30, a first insulating layer 40, and a second insulating layer 50. The semiconductor substrate 10 includes a front surface 10$a$ and a back surface 10$b$ on the opposite side from the front surface 10$a$. The semiconductor substrate 10 has, for example, a P-type conductive type, and is, for example, a silicon substrate. The semiconductor layer 30 is formed on the front surface 10$a$ of the semiconductor substrate 10. The semiconductor layer 30 has, for example, a P-type conductive type, and is, for example, an epitaxial growth layer containing silicon. The first element part 3 and the second element part 5 are configured in the semiconductor layer 30. A thickness of the semiconductor layer 30 is, for example, about 10 μm.

The first element part 3 includes a light receiving portion (pixel portion) 13 and an amplifier 15. The light receiving portion 13 includes, for example, a plurality of two-dimensionally arranged pixels, and generates a signal charge according to incident light hv from the back surface 10$b$ side of the semiconductor substrate 10. The amplifier 15 changes the signal charge generated by the light receiving portion 13 into a signal voltage. The light receiving portion 13 and the amplifier 15 are electrically connected to each other by a wiring W1. An example of a size of the light receiving portion 13 is about 7 mm×7 mm in a plan view. In addition, an example of a size of the amplifier 15 is about 7 mm in the longitudinal direction and about 20 μm in the short direction (direction from the light receiving portion 13 toward a analog-digital converter 17 described later) in a plan view. Further, the wiring W1 and a wiring W3 described later are provided on both sides of the amplifier 15. However, an example of a length of the wiring W1 is about 50 μm, and a length of the wiring W3 is about 150 μm. Note that the wiring W1 may be a transfer electrode. As described above, each of the lengths of the wiring W1 and the wiring W3 is larger than the size of the amplifier 15 in the short direction. That is, each of a distance between the light receiving portion 13 and the amplifier 15 and a distance between the amplifier 15 and the analog-digital converter 17 described later is larger than the size of the amplifier 15 in the short direction.

The second element part 5 includes the analog-digital converter 17, a multiplexer 19, a drive unit 21, and an output unit 23. The analog-digital converter 17 converts a signal voltage output from the first element part 3 into a digital signal. The multiplexer 19 bundles a plurality of digital signals from the analog-digital converter 17 into one digital signal. The drive unit 21 includes, for example, a phase-locked loop (PLL) and a timing generator, and generates a signal for driving the analog-digital converter 17. The output unit 23 includes, for example, an LVDS (Low Voltage Differential signaling) unit, converts a digital signal from the multiplexer 19 into a differential voltage signal, and outputs the converted signal to the outside.

The amplifier 15 and the analog-digital converter 17 are electrically connected to each other by the wiring W3, and the analog-digital converter 17 and the multiplexer 19 are electrically connected to each other by a wiring W5. Further, the analog-digital converter 17 and the drive unit 21 are electrically connected to each other by a wiring W7, and the multiplexer 19 and the output unit 23 are electrically connected to each other by a wiring W9.

The first insulating layer 40 is formed on a front surface of the semiconductor layer 30 on the opposite side from the semiconductor substrate 10 via an insulating film 45 such as a silicon oxide film. The first insulating layer 40 is, for example, a BPSG (Boron Phospho Silicate Glass) layer. A thickness of the first insulating layer 40 is, for example, about 1 μm. The second insulating layer 50 is formed on a front surface of the first insulating layer 40 on the opposite side from the semiconductor layer 30. The second insulating layer 50 contains, for example, a silicon oxide (for example, $SiO_2$). A thickness of the second insulating layer 50 is, for example, about 1 μm.

In the backside incident-type imaging element 1 described above, when the incident light hv is incident on the light receiving portion 13, the incident light hv is converted into a signal charge at each pixel of the light receiving portion 13. The signal charge is transferred between pixels and converted into a signal voltage by the amplifier 15 provided at an end of the light receiving portion. The signal voltage is converted into a digital signal in the analog-digital converter 17. Digital signals are bundled by the multiplexer 19 to form one digital signal. This digital signal is converted into a differential voltage signal by the output unit 23 and output.

Subsequently, a structure of each layer will be described. In the semiconductor layer 30, an N-type channel region 31, a P-type well region 32, and a P$^+$-type region 33 are formed in the first element part 3. A pair of N$^+$-type regions 37 is formed in each of the N-type channel region 31 and the P-type well region 32. A part of the N-type channel region 31 is used for the light receiving portion 13. A rest of the N-type channel region 31 and the P-type well region 32 are used for the amplifier 15. Note that the P$^+$-type means that the concentration of P-type impurities is as high as, for example, about $1 \times 10^{17}$ cm$^{-3}$ or more. Further, the N$^+$-type means that the concentration of N-type impurities is as high as, for example, about $1 \times 10^{20}$ cm$^{-3}$ or more.

Further, in the semiconductor layer 30, an N-type deep well region 34 is formed in the second element part 5. A P-type well region 35 and an N-type well region 36 are formed in the N-type deep well region 34. A plurality of N$^+$-type regions 37 is formed in the P-type well region 35. A plurality of P$^+$-type regions 39 is formed in the N-type well region 36. Further, in the second element part 5, a P$^+$-type region 39 is formed outside the N-type deep well region 34, and a ground GND is electrically connected to the P$^+$-type region 39. In this way, a ground potential is applied to the semiconductor substrate 10 via the P$^+$-type region 39 and the P-type semiconductor layer 30.

The P$^+$-type region 39 and the N$^+$-type regions 37 are exposed on the front surface of the semiconductor layer 30 via the insulating film 45. A plurality of wiring portions 41 is formed inside the first insulating layer 40. The wiring portions 41 contain, for example, polysilicon. The wiring portions 41 are formed on the semiconductor layer 30 side, and are formed to come into contact with the semiconductor layer 30 via the insulating film 45. A plurality of metal wiring portions 51 is formed inside the second insulating layer 50. The metal wiring portions 51 contain, for example, aluminum, etc. The metal wiring portions 51 may provide, for example, the wirings W1 to W9 described above.

Here, the semiconductor substrate 10 includes a first region 10A, a second region 10B, and a third region 10C. The first region 10A is a region corresponding to the light receiving portion 13. In other words, the first region 10A is a region including the light receiving portion 13 when viewed in a first direction intersecting with (orthogonal to) the front surface 10a and the back surface 10b. The second region 10B is a region corresponding to the analog-digital converter 17. In other words, the second region 10B is a region including the analog-digital converter 17 when viewed in the first direction. The third region 10C is located between the first region 10A and the second region 10B.

Further, a thickness of the semiconductor substrate 10 in the first direction (distance between the front surface 10a and the back surface 10b) is relatively thicker in the second region 10B than in the first region 10A. This point will be described in more detail. A recess 60 recessed on the front surface 10a side from the first region 10A to the third region 10C is formed on the back surface 10b of the semiconductor substrate 10. In this way, the thickness of the semiconductor substrate 10 is made relatively thinner in the first region 10A than in the second region 10B. On the other hand, in the second region 10B, the thickness of the semiconductor substrate 10 is maintained. That is, the semiconductor substrate 10 is thinned in the region corresponding to the light receiving portion 13, and an original thickness (for example, 300 μm) thereof remains in the region corresponding to the analog-digital converter 17.

In particular, here, the recess 60 penetrates the semiconductor substrate 10 (that is, a bottom surface 61 of the recess 60 serves as the front surface of the semiconductor layer 30). In other words, the thickness of the semiconductor substrate 10 is set to 0 at least in the first region 10A. In other words, at a bottom of the recess 60, the semiconductor layer 30 is exposed from the semiconductor substrate 10.

An inner side surface of the recess 60 includes an inclined surface 63 located in the third region 10C and is inclined so that the thickness of the semiconductor substrate 10 gradually (continuously) increases from the first region 10A to the second region 10B. The inclined surface 63 does not reach the second region 10B when viewed in the first direction. The amplifier 15 (and the wirings W1 and W3) is disposed on the third region 10C including the inclined surface 63. That is, the amplifier 15 is located in the third region 10C including the inclined surface 63 when viewed in the first direction. The recess 60 can be formed, for example, by etching, etc. Note that a width of the third region 10C in a direction from the first region 10A to the second region 10B is a total length of the amplifier 15, the wiring W1, and the wiring W2 described above, and is, for example, about 220 μm. By ensuring the width of the third region 10C to this extent, it is possible to maintain the thickness of the semiconductor substrate 10 over the entire second region 10B without causing the inclined surface 63 to reach the second region 10B.

Note that here, the third region 10C includes a part in which a thickness changes according to inclination of the inclined surface 63 and a part in which the thickness is constant with the thickness of the second region 10B. Further, the semiconductor substrate 10 includes a fourth region 10D. The fourth region 10D is located on the opposite side of the second region 10B from the first region 10A and the third region 10C. The fourth region 10D is a region corresponding to a part of the second element part 5 other than the analog-digital converter 17.

Here, the fourth region 10D mainly includes the multiplexer 19 and the output unit 23 when viewed in the first direction. Further, the thickness of the semiconductor substrate 10 is constant with the thickness of the second region 10B in the fourth region 10D. In addition, a frame 10c in which the thickness of the second region 10B is maintained is formed at an outer peripheral portion of the backside incident-type imaging element 1 (here, an outer edge of the first region 10A).

Note that an antireflection film 71 is formed on the back surface 10b of the semiconductor substrate 10, including an inner surface of the recess 60. The antireflection film 71 contains, for example, a silicon oxide (for example, SiO$_2$). A thickness of the antireflection film 71 is, for example, about 0.1 μm. Further, a light-shielding film 73 is formed on the antireflection film 71. The light-shielding film 73 is, for example, aluminum. A thickness of the light-shielding film 73 is, for example, about 1 μm. An opening is formed in the light-shielding film 73 on the bottom surface 61 of the recess 60, and the light receiving portion 13 is exposed from the opening when viewed in the first direction. The opening of the antireflection film 71 provides an incident portion of the incident light hv on the light receiving portion 13. Further, a P$^+$-type region 38 is formed in an area corresponding to the bottom surface 61 of the recess 60 in the semiconductor layer 30.

As described above, in the backside incident-type imaging element 1, the semiconductor layer 30 formed on the front surface 10a of the semiconductor substrate 10 has the first element part 3 and the second element part 5. The first element part 3 includes the light receiving portion 13 that generates a signal charge according to the incident light hv from the back surface 10b side of the semiconductor substrate 10. Further, the second element part 5 includes the analog-digital converter 17 that converts a signal voltage into a digital signal. In addition, the thickness of the semiconductor substrate 10 is relatively thicker in the second region 10B corresponding to the analog-digital converter 17 than in the first region 10A corresponding to the light receiving portion 13.

In other words, the semiconductor substrate 10 is thin in the region corresponding to the light receiving portion 13 and thickened in the region corresponding to the analog-digital converter 17. As a result, the amount of light incident on the light receiving portion 13 from the first region 10A of the semiconductor substrate 10 is increased, and the resistance of the second region 10B corresponding to the analog-digital converter 17 of the semiconductor substrate 10 can be avoided. Therefore, according to the backside incident-type imaging element 1, the processing speed can be improved by achieving both high sensitivity and stabilization of the ground.

Further, in the backside incident-type imaging element 1, the semiconductor substrate 10 includes the third region 10C located between the first region 10A and the second region 10B when viewed in the first direction. In addition, the thickness of the semiconductor substrate 10 is made relatively thinner in the first region 10A than in the second region 10B by the recess 60 provided on the back surface 10b from the first region 10A to the third region 10C. Further, in the backside incident-type imaging element 1, the inner side surface of the recess 60 includes the inclined surface 63 located in the third region 10C and inclined so that the thickness of the semiconductor substrate 10 gradually increases from the first region 10A to the second region 10B. In this way, it is possible to make the first region 10A thinner and the second region 10B thicker by the recess 60 provided on the back surface 10b of the semiconductor substrate 10. Further, since the inner side surface of the recess 60 has the inclined surface 63 (since the inclined surface 63 reaches an opening end of the recess 60), the open end of the recess 60 is obtuse. In this way, occurrence of chips and cracks at the opening end of the recess 60 is suppressed, and as a result, damage to the backside incident-type imaging element 1 is suppressed.

Further, in the backside incident-type imaging element 1, the first element part 3 includes the amplifier 15 that converts the signal charge generated by the light receiving portion 13 into a signal voltage. Further, the amplifier 15 is located in the third region 10C when viewed in the first direction. In this way, the amplifier 15 rarely affected by the thickness of the semiconductor substrate 10 can be disposed in the third region 10C.

Furthermore, in the backside incident-type imaging element 1, the semiconductor layer 30 is exposed from the semiconductor substrate 10 at the bottom of the recess 60. Therefore, the amount of incident light from the first region 10A to the light receiving portion 13 can be further increased.

The embodiment has described one aspect of the disclosure. Therefore, the disclosure is not limited to the backside incident-type imaging element 1 described above, and various modifications are possible. Hereinafter, modifications will be described.

Figure 3:
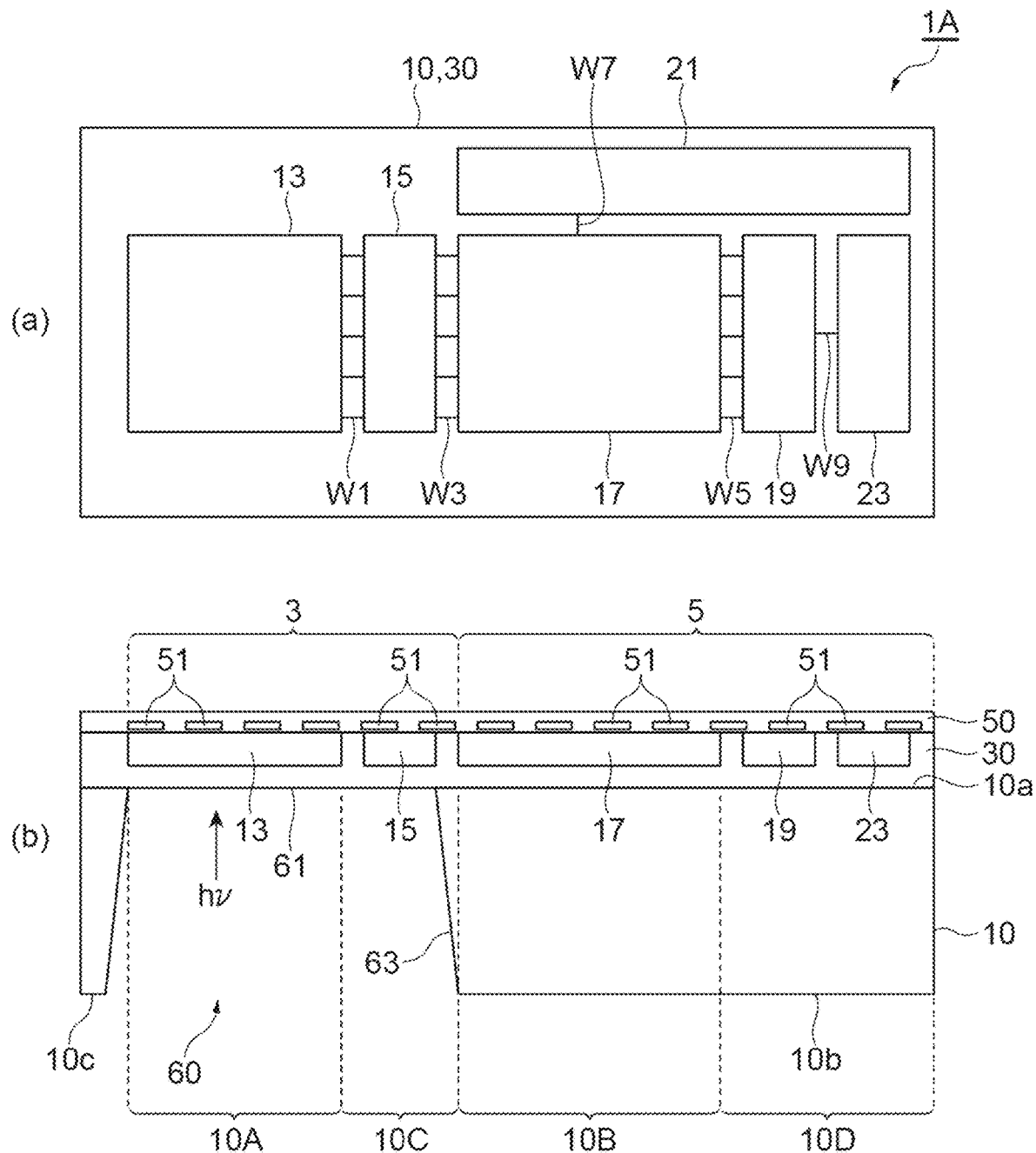
FIG. 3 is a schematic view illustrating a backside incident-type imaging element according to a first modification.
Figure 4:
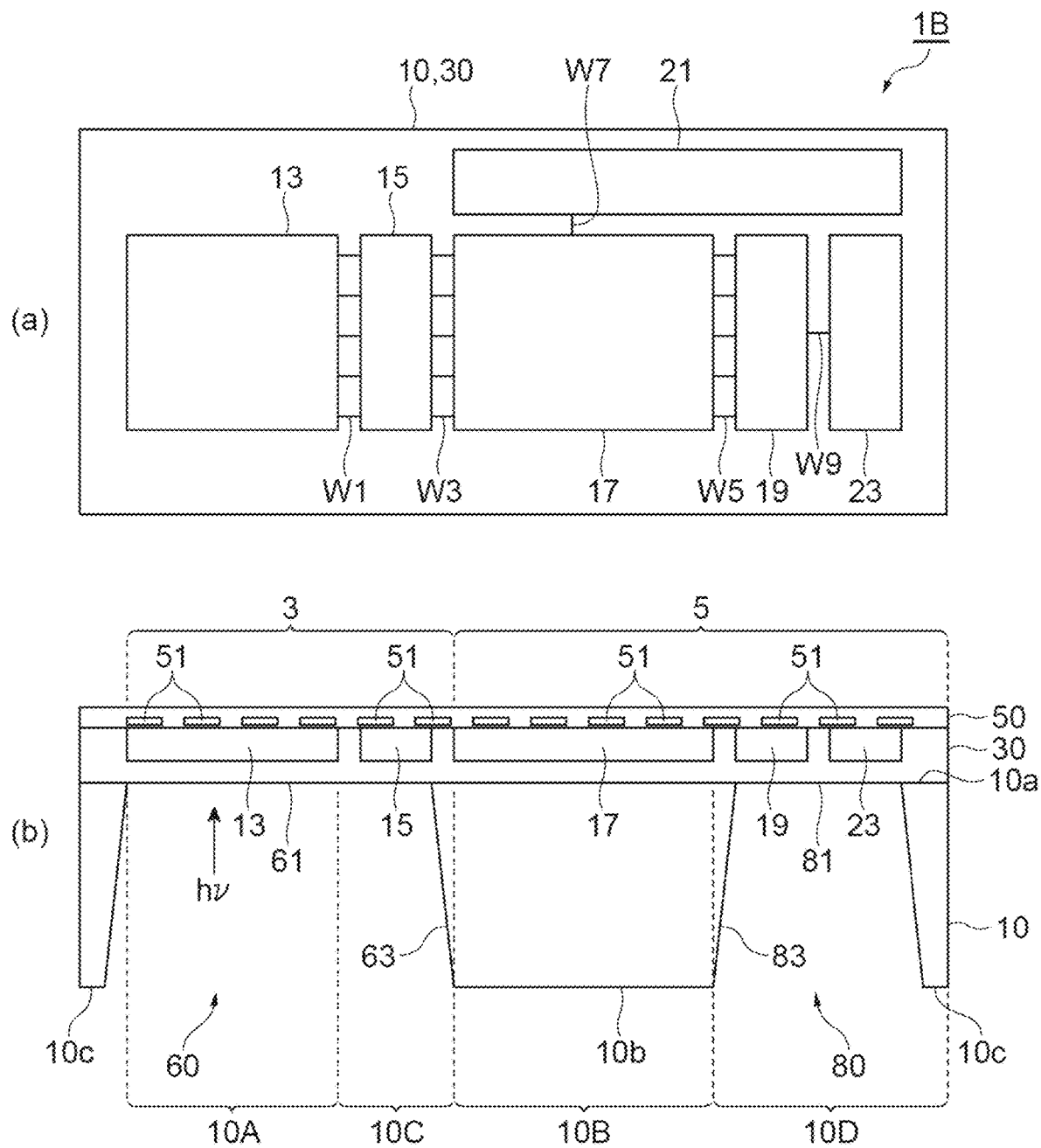
FIG. 4 is a schematic view illustrating a backside incident-type imaging element according to a second modification.

FIGS. 3 and 4 are schematic views illustrating backside incident-type imaging elements according to first and second modifications. As illustrated in FIG. 3, a backside incident-type imaging element 1A according to the first modification is the same as the backside incident-type imaging element 1 in a plan view (which is similarly applied hereinafter when viewed in the first direction), and is different from the backside incident-type imaging element 1 only in a cross-sectional shape of the semiconductor substrate 10. That is, in the backside incident-type imaging element 1A, the recess 60 is enlarged when compared to the backside incident-type imaging element 1. More specifically, in the backside incident-type imaging element 1A, the recess 60 is formed over the entire third region 10C, and the third region 10C does not include a part in which the thickness is constant with the thickness of the second region 10B. In this way, the semiconductor substrate 10 is thinned by the recess 60 in the entire third region 10C. That is, in this example, the semiconductor substrate 10 is thinned including the region corresponding to the amplifier 15.

In addition, as illustrated in FIG. 4, a backside incident-type imaging element 1B according to the second modification is the same as the backside incident-type imaging elements 1 and 1A in a plan view, and is different from the backside incident-type imaging elements 1 and 1A only in a cross-sectional shape of the semiconductor substrate 10. That is, the backside incident-type imaging element 1B is different from the backside incident-type imaging element 1A in that the thickness is relatively thicker in the second region 10B than in the fourth region 10D. More specifically, in the backside incident-type imaging element 1B, the thickness of the semiconductor substrate 10 is relatively thinner in the fourth region 10D than in the second region 10B by providing a recess 80 on the back surface 10b of the semiconductor substrate 10. That is, in this example, in the semiconductor substrate 10, only the region corresponding to the analog-digital converter 17 is thickened, and a region corresponding to elements other than the analog-digital converter 17 is thinned.

Here, the recess 80 penetrates the semiconductor substrate 10 (that is, the bottom surface 81 of the recess 80 becomes the front surface of the semiconductor layer 30). In other words, the thickness of the semiconductor substrate 10 is set to 0 in the fourth region 10D. Further, in other words, at the bottom of the recess 80, the semiconductor layer 30 is exposed from the semiconductor substrate 10. The inner side surface of the recess 80 includes an inclined surface 83 located in the fourth region 10D and inclined so that the thickness of the semiconductor substrate 10 gradually (continuously) increases from the fourth region D to the second region 10B.

As in the backside incident-type imaging elements 1A and 1B, the semiconductor substrate 10 may be configured such that the thickness of the second region 10B corresponding to (immediately below) the analog-digital converter 17 is relatively thick, and the thickness of any other region is relatively thin. In this way, it is possible to avoid the increase in the resistance of the semiconductor substrate 10 immediately below the analog-digital converter 17 while ensuring the amount of light incident on the light receiving portion 13. That is, the processing speed can be improved by achieving both high sensitivity and stabilization of the ground.

Figure 5:
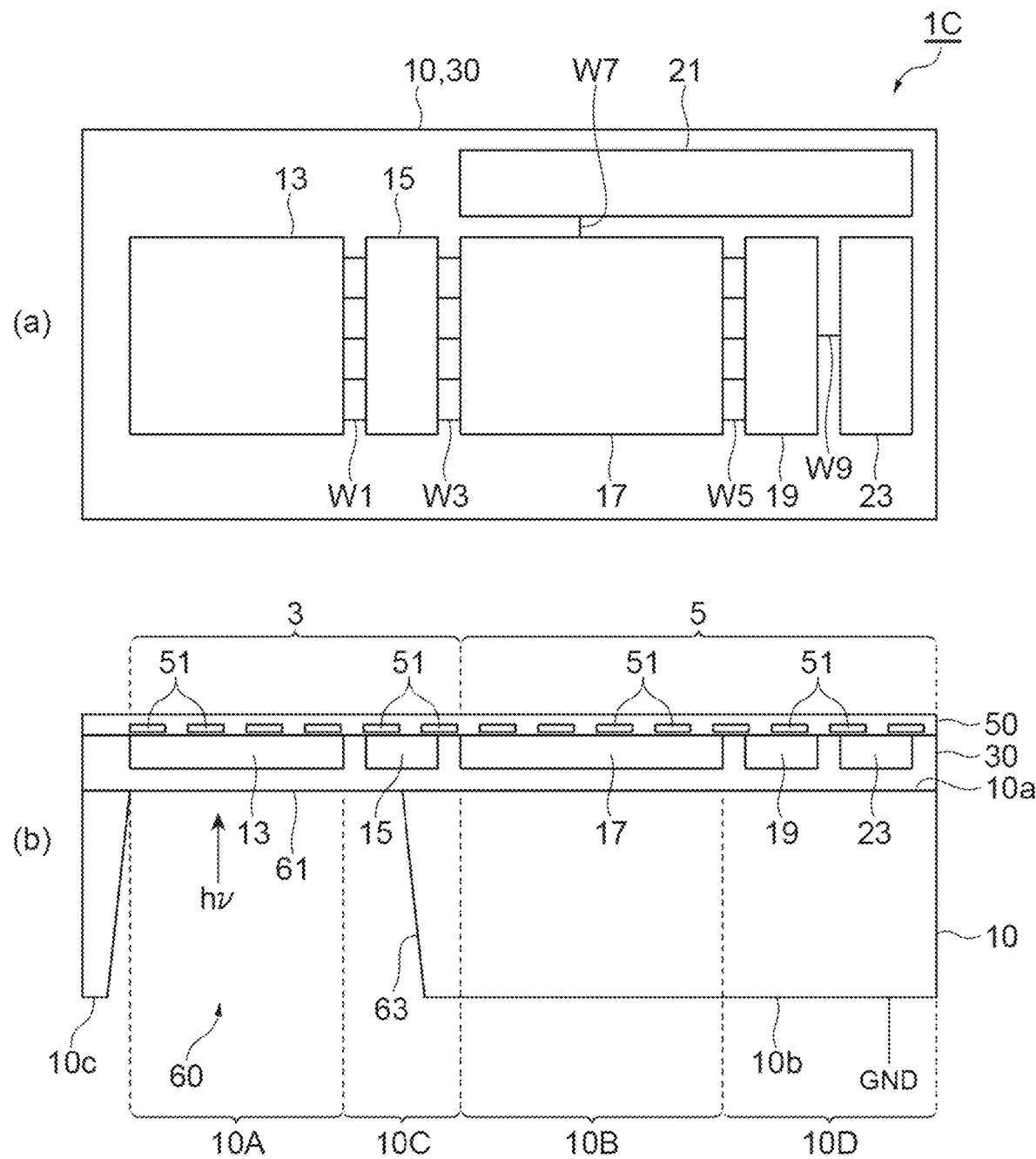
FIG. 5 is a schematic view illustrating a backside incident-type imaging element according to a third modification.

FIG. 5 is a schematic view illustrating a backside incident-type imaging element according to a third modification. As illustrated in FIG. 5, a backside incident-type imaging element 1C according to the third modification has the same structure as that of the backside incident-type imaging element 1. The backside incident-type imaging element 1C is different from the backside incident-type imaging element 1 in that the semiconductor substrate 10 is directly electrically connected to the ground GND. In this way, a form in which the ground potential is applied to the semiconductor substrate 10 is arbitrary.

FIG. 6 is a schematic view illustrating a backside incident-type imaging element according to a fourth modification. As illustrated in FIG. 6, a backside incident-type imaging element 1D includes a first element part 3 and a pair of second element parts 5 disposed on both sides of the first element part 3 to interpose the first element part 3 therebetween. That is, the backside incident-type imaging element 1D has a structure in which a single CCD unit and a pair of CMOS units are formed (integrated) on a single semiconductor substrate 10. The structure of the first element part 3 and the pair of second element parts 5 including a cross-sectional structure of the semiconductor substrate 10 is the same as that of the backside incident-type imaging element 1.

Furthermore, in the above embodiment and modifications, structures of the respective parts can be arbitrarily adopted between each other. As an example, the structure of the fourth region 10D of the backside incident-type imaging element 1B according to the second modification can be adopted for the backside incident-type imaging elements 1, 1A, 1C, and 1D according to the embodiment and the other modifications. Further, as another example, the structure including the pair of second element parts 5 of the backside incident-type imaging element 1D according to the fourth modification can be adopted for the backside incident-type imaging elements 1A, 1B, and 1C according to the other modifications.

Note that the backside incident-type imaging elements 1 to 1D according to the embodiment and the modifications are configured in long shapes with an arrangement direction of the light receiving portion 13, the amplifier 15, the analog-digital converter 17, the multiplexer 19, and the output unit 23 as the longitudinal direction in a plan view. On the other hand, the backside incident-type imaging elements may be configured in long shapes with a direction (second direction) intersecting (orthogonal to) the arrangement direction of the light receiving portion 13, the amplifier 15, the analog-digital converter 17, the multiplexer 19, and the output unit 23 as the longitudinal direction in the plan view.

In this case, the light receiving portion 13, the amplifier 15, the analog-digital converter 17, the multiplexer 19, and the output unit 23 may be formed in long shapes in the second direction. In this instance, the output unit 23 may be divided into a plurality of parts arranged in the second direction.

Here, in the above-mentioned example, the CCD has been mentioned as the first element part 3. However, the first element part 3 may be an active pixel sensor having an amplifier in each pixel. In this case, the amplifier 15 located in the third region 10C becomes unnecessary. However, in this case, on the third region 10C including the inclined surface 63 (that is, the thickness of the semiconductor substrate 10 changes), the wirings W1 and W3 electrically connecting the light receiving portion 13 and the analog-digital converter 17 to each other may be disposed without disposing the light receiving portion 13 and the analog-digital converter 17 affected by the change in the thickness of the semiconductor substrate 10.

In addition, the above-described example shows a case where the thickness of the semiconductor substrate 10 becomes 0 in the first region 10A corresponding to the light receiving portion 13 of the semiconductor substrate 10. However, in the first region 10A, the thickness of the semiconductor substrate 10 does not have to be 0, and it is sufficient that the transmittance of the incident light hv of the first region 10A to the semiconductor layer 30 (the amount of incident light to the light receiving portion 13) is larger than that of the second region 10B.

INDUSTRIAL APPLICABILITY

According to the disclosure, it is possible to provide a backside incident-type imaging element capable of improving processing speed.

REFERENCE SIGNS LIST 1, 1A, 1B, 1C, 1D: backside incident-type imaging element, 3: first element part, 5: second element part, 10: semiconductor substrate, 10a: front surface, 10b: back surface, 10A: first region, 10B: second region, 10C: third region, 13: light receiving portion, 15: amplifier, 17: analog-digital converter, 30: semiconductor layer, 60: recess, 63: inclined surface.

The invention claimed is:

1. A backside incident-type imaging element comprising:
a semiconductor substrate having a front surface and a back surface on an opposite side from the front surface, a ground potential being applied to the semiconductor substrate; and
a semiconductor layer formed on the front surface,
wherein the semiconductor layer has
a first element part including a light receiving portion configured to generate a signal charge according to incident light from a side of the back surface and configured to output a signal voltage corresponding to the signal charge, and
a second element part including an analog-digital converter configured to convert the signal voltage output from the first element part into a digital signal, and
a thickness of the semiconductor substrate in a first direction intersecting the front surface and the back surface is relatively thicker in a second region of the semiconductor substrate corresponding to the analog-digital converter when viewed in the first direction than in a first region of the semiconductor substrate corresponding to the light receiving portion when viewed in the first direction.

2. The backside incident-type imaging element according to claim 1,
wherein the semiconductor substrate includes a third region located between the first region and the second region when viewed in the first direction, and
the thickness of the semiconductor substrate is made relatively thinner in the first region than in the second region by a recess provided on the back surface from the first region to the third region.

3. The backside incident-type imaging element according to claim 2, wherein an inner side surface of the recess includes an inclined surface located in the third region and inclined so that the thickness of the semiconductor substrate gradually increases from the first region to the second region.

4. The backside incident-type imaging element according to claim 3,
wherein the first element part includes an amplifier configured to convert the signal charge generated by the light receiving portion into the signal voltage, and
the amplifier is located in the third region when viewed in the first direction.

5. The backside incident-type imaging element according to claim 2, wherein the semiconductor layer is exposed from the semiconductor substrate at a bottom of the recess.

* * * * *